United States Patent
Sinha et al.

(10) Patent No.: US 9,153,485 B2
(45) Date of Patent: Oct. 6, 2015

(54) METHODS OF PROCESSING SUBSTRATES AND METHODS OF FORMING CONDUCTIVE CONNECTIONS TO SUBSTRATES

(71) Applicant: Micron Technology, Inc., Boise, ID (US)

(72) Inventors: Nishant Sinha, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/258,885

(22) Filed: Apr. 22, 2014

(65) Prior Publication Data
US 2014/0248769 A1    Sep. 4, 2014

Related U.S. Application Data

(63) Continuation of application No. 11/868,331, filed on Oct. 5, 2007, now Pat. No. 8,721,901.

(51) Int. Cl.
*C23F 3/00* (2006.01)
*H01L 21/768* (2006.01)

(52) U.S. Cl.
CPC .... *H01L 21/76879* (2013.01); *H01L 21/76814* (2013.01); *H01L 21/76843* (2013.01); *H01L 21/76849* (2013.01); *H01L 21/76867* (2013.01); *H01L 21/76826* (2013.01)

(58) Field of Classification Search
CPC .............. H01L 21/76814; H01L 21/76826; H01L 21/76843

USPC .............. 216/18, 37, 79, 67, 99, 57; 427/252, 427/299
See application file for complete search history.

(56) References Cited

U.S. PATENT DOCUMENTS

| | | | |
|---|---|---|---|
| 4,193,783 | A | 3/1980 | Matsushita |
| 4,911,784 | A | 3/1990 | Hensel et al. |

(Continued)

FOREIGN PATENT DOCUMENTS

| | | |
|---|---|---|
| JP | 1-243548 | 9/1989 |

OTHER PUBLICATIONS

Igarashi et al., "Thermal Stability of Copper Interconnects Fabricated by Dry-Etching Process", Thin Solid Films 262, 1995, Netherlands, pp. 124-128.

(Continued)

*Primary Examiner* — Lan Vinh
*Assistant Examiner* — Maki Angadi
(74) *Attorney, Agent, or Firm* — Wells St. John P.S.

(57) ABSTRACT

Embodiments disclosed include methods of processing substrates, including methods of forming conductive connections to substrates. In one embodiment, a method of processing a substrate includes forming a material to be etched over a first material of a substrate. The material to be etched and the first material are of different compositions. The material to be etched is etched in a dry etch chamber to expose the first material. After the etching, the first material is contacted with a non-oxygen-containing gas in situ within the dry etch chamber effective to form a second material physically contacting onto the first material. The second material comprises a component of the first material and a component of the gas. In one embodiment, the first material is contacted with a gas that may or may not include oxygen in situ within the dry etch chamber effective to form a conductive second material.

16 Claims, 4 Drawing Sheets

(56) References Cited

U.S. PATENT DOCUMENTS

| | | | | |
|---|---|---|---|---|
| 5,105,253 | A | * | 4/1992 | Polllock .................. 257/514 |
| 5,633,199 | A | * | 5/1997 | Fiordalice et al. ............ 438/642 |
| 6,316,353 | B1 | | 11/2001 | Selsley |
| 2004/0011554 | A1 | * | 1/2004 | Chopra et al. ................ 174/250 |
| 2004/0031689 | A1 | | 2/2004 | Lim et al. |
| 2007/0202254 | A1 | * | 8/2007 | Ganguli et al. ............... 427/252 |

OTHER PUBLICATIONS

Singer, "Controlling Copper Electromigration", Semiconductor International, Dec. 1, 2006, United States, 2 pages.

Ueki et al., "Effects of Ti Addition on Via Reliability in Cu Dual Damascene Interconnects" IEEE Transactions on Electron Devices, 2004, United States, 9 pages.

Wang et al., "Binary Cu-Alloy Layers for Cu-Interconnctions Reliability Improvement", IEEE, 2001, United States, pp. 86-88.

Wang et al., "Charaterization of Cu-Al Alloy/SiO2 Interface Microstructure", Materials Research Society Symposium Proceedings vol. 615, 2000, United States, pp. G7.5.1-G7.5.6.

Wang et al., "Evolution of the Cu-Al Alloy/SiO2 Interfaces During Bias Temperature Stressing", Journal of the Electrochemical Society vol. 148, No. 2, 2001, United States, pp. G78-G81.

* cited by examiner

METHODS OF PROCESSING SUBSTRATES AND METHODS OF FORMING CONDUCTIVE CONNECTIONS TO SUBSTRATES

RELATED PATENT DATA

This patent resulted from a continuation of U.S. patent application Ser. No. 11/868,331 which was filed Oct. 5, 2007 and which is incorporated herein by reference.

TECHNICAL FIELD

Embodiments disclosed herein pertain to methods of processing substrates, including methods of forming conductive connections to substrates.

BACKGROUND

Copper is a material finding increasing use as a conductive metal in interconnections for high performance integrated circuit applications. It has lower electrical resistance and better electromigration performance in comparison with many other metals, including aluminum. Copper can be readily deposited by chemical vapor deposition, physical vapor deposition, electroless deposition, and electroplating. Chemical vapor deposition and electroplating techniques provide good step coverage, with electroplating techniques usually being the lower cost of the two.

Copper interconnects are typically formed within or adjacent various interlevel dielectric layers which commonly comprise silicon dioxide. Unfortunately, copper can migrate or diffuse into silicon dioxide when subjected to high temperature or high bias. Copper diffusion into silicon dioxide tends to one or both of deteriorate the insulative characteristics of the silicon dioxide and may cause device leakage currents. Further, copper does not readily adhere to silicon dioxide surfaces. To overcome these issues, adhesion promoter/diffusion barrier layers have been provided intermediate copper interconnects and interlayer dielectrics such as silicon dioxide. Example adhesion promoter/diffusion barrier layer materials include physical vapor deposited tantalum or tantalum nitride. A copper-comprising seed layer is then typically deposited over the barrier layer to provide a highly conductive surface for subsequent copper deposition using electroplating.

Recently, the copper seed layer has been formed to comprise an alloy of copper and aluminum or an alloy of copper and magnesium. It has been discovered that subsequent heating of the substrate has a tendency to cause the aluminum and/or magnesium atoms within the seed layer to migrate into the electroplated copper and to the elevationally outermost surface thereof. Such desirably forms a conductive passivation layer which can serve to both protect the outer copper surface and provide a good conductive interconnect for metal which might be deposited subsequently in conductive connection therewith. Yet, the migration of the aluminum and/or magnesium atoms to the outer surface of the electroplated copper is not very controlled, and does not produce readily repeatable results. Embodiments of the invention were motivated in addressing the above-identified issues. However, the artisan will appreciate that embodiments of the invention will have applicability beyond addressing the above-identified issues, and as is explained and expanded upon below.

DETAILED DESCRIPTION OF EXAMPLE EMBODIMENTS

Embodiments of the invention encompass methods of forming a conductive connection to a substrate as well as methods of processing a substrate independent of whether a conductive connection is made. Example embodiments of methods of forming a conductive connection to a substrate are initially described with reference to FIGS. 1-4.

Figure 1:
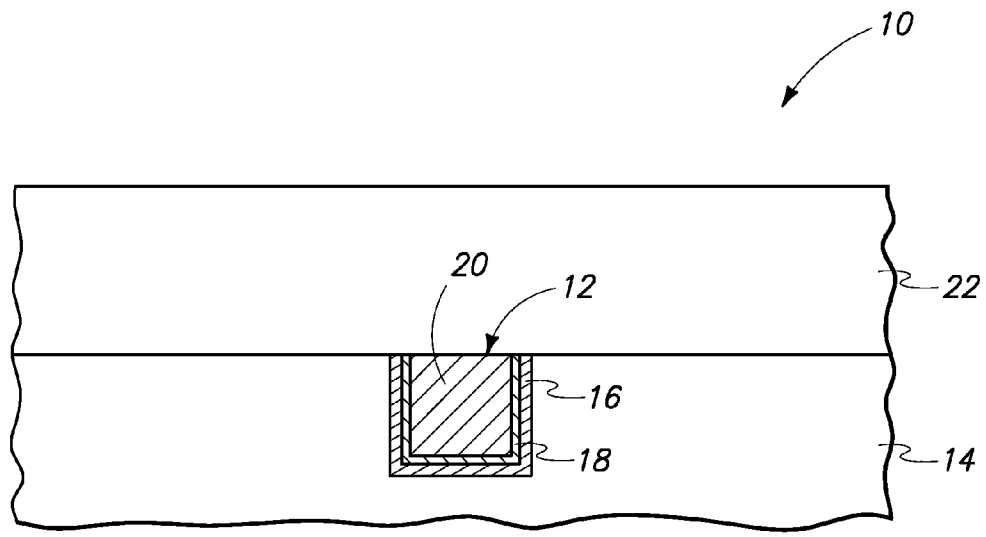
FIGS. 1-4 illustrate cross-sectional views of a portion of a substrate during various stages of fabrication in accordance with an embodiment of the invention.

FIG. 1 depicts a substrate 10 which in one embodiment comprises a semiconductive substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Example substrate 10 includes a conductive structure 12 which is received within an interlevel dielectric 14. Dielectric 14 may be homogenous or non-homogenous. Example materials include doped or undoped silicon dioxide, and silicon nitride. Conductor 12 is depicted as comprising a damascene-formed line received within dielectric 14, although other conductive structures might of course be utilized. Further, not all embodiments of the invention require substrate processing relative to making conductive connections, as will be apparent from the continuing discussion. Nevertheless, in one embodiment, conductive structure 12 comprises a copper-containing conductor. For example, a copper-containing conductor 12 may comprise a physical vapor deposited tantalum or tantalum nitride-comprising layer 16 having a physical vapor deposited copper-containing seed layer 18 formed thereover. Layer 18 may consist essentially of copper, comprise copper alloyed with one or more metals, and/or a copper compound. A copper layer 20 has been electroplated over copper seed layer 18. Copper layer 20 may consist essentially of elemental copper, comprise an alloy of copper with one or more other metals, and/or a copper compound. Other conductive materials might also of course be utilized.

For purposes of the continuing discussion, material 20 may be considered as a first material which in one embodiment is conductive. In other embodiments, the first material may not be conductive and may be insulative or semiconductive. One manner of forming structure 12 comprises depositing layers 16, 18, and 20 to within the depicted opening in material 14 and outwardly thereof. Such layers may then be etched or polished back at least to an outer surface of material 14 to form the depicted structure 12 therein.

A dielectric material 22 has been formed over first material 20 and copper-containing conductor 12. Material 22 may be homogenous or non-homogenous, and may comprise the same or different material as that of material 14.

Figure 2:
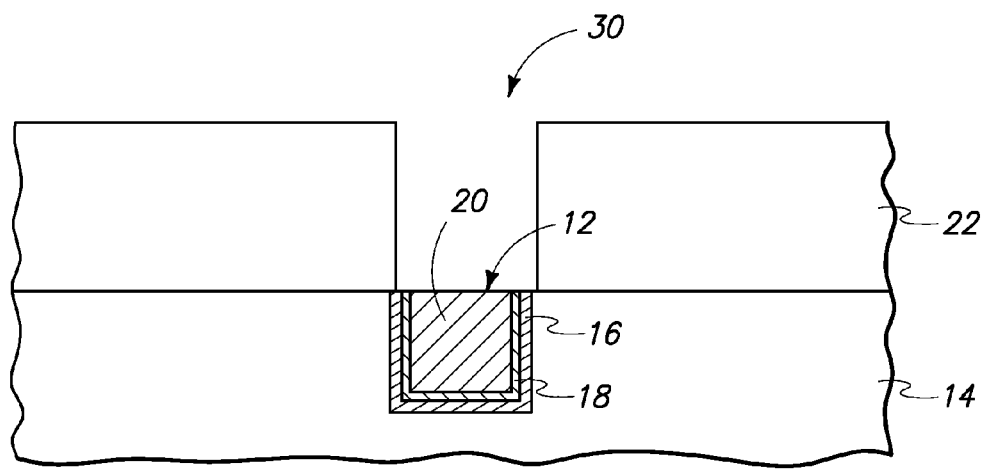

Substrate 10 is provided within a dry etch chamber (not shown). An example such chamber is the DPSII G3 HT available from Applied Materials of Santa Clara, Cal., which has the capability of conducting dry etching at high temperatures, for example at 300° C. and greater. Referring to FIG. 2, an opening 30 has been etched through dielectric material 22 within the dry etch chamber to expose first material 20 of the example copper-containing conductor 12. Any suitable dry etching chemistry might be utilized, for example, fluorocarbon based chemistries where dielectric material 22 comprises doped silicon dioxide. Plasma may or may not be used. Any suitable etching conditions might be used.

Figure 3:
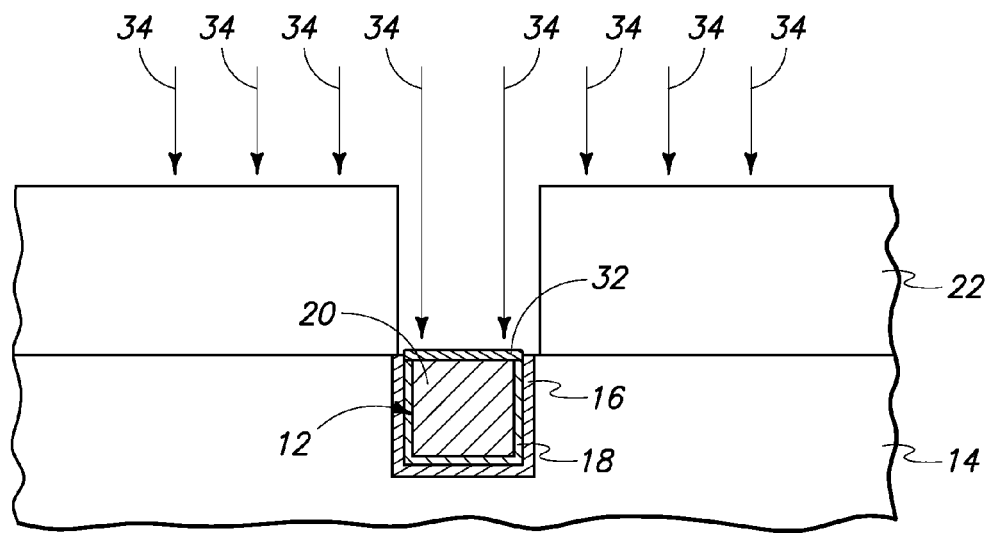

Referring to FIG. 3, and after the etching of FIG. 2, copper-containing conductor 12 has been contacted with a gas in situ within the dry etch chamber within which the FIG. 2 etch occurred effective to form a conductive second material 32 at a base of opening 30. Conductive second material 32 comprises a component of first material 20 and a component of the gas with which material 32 was contacted. By way of example only, downwardly directed arrows 34 in FIG. 3 depict exposure of substrate 10 to a gas, and contacting thereof with conductive structure 12 effective to form second conductive material 32. In one embodiment, where for example first material 20 comprises copper, the gas contains at least one metal other than copper which forms second material 32 to comprise a conductive copper-comprising alloy which physically contacts onto copper-containing conductor 12 at the base of opening 30, thereby comprising an alloy of copper and such other metal from the gas. In one embodiment, the metal from the gas which is other than copper comprises at least one of Al, Mg, Ti, Sn, and In, with the conductive copper-comprising alloy comprising copper in at least one of Al, Mg, Ti, Sn, and In. Alternate example metals include Ir, Rh, Ba, Hf, Ti, Co, Mn, Ru, Zn, Cd, La, Ce, Cr, Se, Fe, La, Pb, Li, Ni, Pd,k Ta, Pt, Ag, Na, St, Zr, Sb, W, Ba, V, and Y.

Regardless and in one embodiment, conductive second material 32 comprises a component of first material 20 and a component of the gas with which the first material is contacted. In one embodiment, the component of the first material comprises a metal, for example in any of elemental, alloy, or compound form, and the gas comprises oxygen as the component incorporated in conductive second material 32, for example forming a conductive metal oxide. Further by way of example only, material 20 might also comprise tungsten, and the conductive second material might comprise conductive tungsten oxide. In such examples, the oxygen might be, by way of example, any of $O_2$, $O_3$, or oxygen combined in other compounds containing elements in addition to oxygen, for example $NO_x$. In one embodiment, the component of the first material comprises silicon, the component of the gas comprises metal, and the conductive second material comprises a conductive metal silicide.

The gas with which the first material is contacted may comprise one or both of an organic compound or an inorganic compound. Example inorganic compounds include metal halides, for example $AlX_3$ and $MgX_2$ using aluminum and magnesium as example metals, and where "X" comprises a halogen. Regardless, the gas may or may not comprise a halogen, and if so which may or may not be incorporated within second material 32. In one embodiment where for example the gas comprises an organic compound comprising a carbonyl, a carbonyl therefrom may be incorporated into second material 32. In one embodiment, the first material comprises a first metal and the gas comprises a second metal different from the first metal, with the conductive second material comprising an alloy of the first and second metals.

Where the gas comprises an organic compound having a metal therein which is incorporated within second material 32, the following are example such gaseous organic compounds.

Aluminum acetylacetonate
Aluminum tris(2,2,6,6-tetramethyl-3,5-heptanedionate)
Bis(cyclopentadienyl)magnesium(II)
Bis(diethylamido)bis(dimethylamido)titanium(IV)
Bis(diethylamido)bis(dimethylamido)titanium(IV)
Bis(ethylcyclopentadienyl)manganese(II)
Indium(III)acetylacetonate
Magnesium acetylacetonate dehydrate
Magnesium bis(2,2,6,6-tetramethyl-3,5-heptanedionate)hydrate
Magnesium hexafluoroacetylacetonate 1,2-dimethoxyethane
Manganese(II)acetylacetonate
Manganese(II)hexafluoroacetylacetonate trihydrate
Tetrakis(diethylamido)titanium(IV)
Tetrakis(dimethylamido)titanium(IV)
Tin(IV)bis(acetylacetonate)dichloride
Titanium diisopropoxide bis(acetylacetonate)
Titanium(IV)diisopropoxidebis(2,2,6,6-tetramethyl-3,5-heptanedionate)
Titanium(IV)oxide acetylacetonate The contacting of the first material with the gas in situ within the dry etch chamber can be conducted under any suitable conditions. By way of example only, an example temperature range is from about 100° C. to about 400° C., and an example pressure range is from about 10 mTorr to about 100 mTorr. Plasma may or may not be utilized. In one embodiment, contacting with the gas is at a temperature of at least 200° C., and in another embodiment at a temperature of at least 300° C. In one embodiment, the etching might be at a temperature below 200° C., and the contacting might be at a temperature above 200° C. In another embodiment, the etching and the contacting occur at 250° C. or greater.

Figure 4:
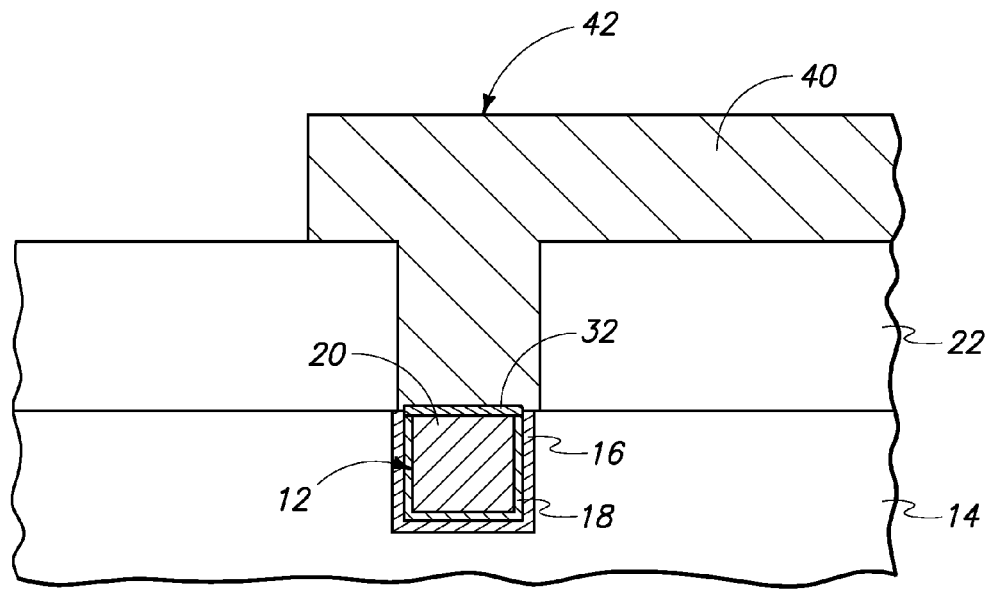

Referring to FIG. 4, a conductive third material 40 has been deposited to within opening 30 in conductive connection with conductive second material 32. Conductive third material 40 might comprise any one or combination of the conductive materials of the example layers 16, 18, and 20, and/or different material. Conductive material 40 in FIG. 4 is depicted as having been deposited to overfill remaining volume of opening 30, and then subtractively patterned and etched to form the depicted example conductive line 42. Of course, material 40 might comprise multiple different conductive materials, and be homogenous or non-homogenous. Regardless and by way of example only, the conductive third material formed within opening 30 might be formed as one or more deposited layers, and as an alternate example might be in the form of a separate or distinctive conductive via to the example underlying conductive structure 12 formed apart or separate from any overlying conductive line.

The above description regarding FIGS. 1-4 primarily pertained to example embodiments of methods of forming a conductive connection to a substrate. However in another aspect, an embodiment of the invention can be considered as a method of processing a substrate which includes forming a material to be etched over a first material of the substrate, where the material to be etched and the first material are different in composition. For example, material 20 in the above-described embodiment might comprise an example such first material, and material 22 formed thereover comprising a material to be etched. The first material might be conductive, semiconductive, or insulative. Further, the material to be etched might be conductive, semiconductive, or insulative. In one embodiment, the first material comprises a metal, for example being in any of elemental form, alloy form, or in metal compound form. In one embodiment, the first material comprises silicon, for example in elemental or compound form, and for example comprising at least one of monocrystalline silicon or polysilicon.

Regardless, the substrate is provided within a dry etch chamber and the material to be etched is etched within the dry etch chamber to expose the first material. In the example depicted in FIG. 2, the etching is of an opening 30 within a material 22. However, the etching need not be of an opening. For example and by way of example only, the etching may be a complete blanket etch essentially removing all of the material being etched from the substrate effective to expose the first material. Alternately, the etching might remove only a portion of the material to expose the first material without necessarily forming one or more openings.

After the etching, the first material is contacted in one embodiment with a non-oxygen-containing gas in situ within the dry etch chamber effective to form a second material which is physically contacting onto the first material, with the second material comprising a component of the first material and a component of the gas. Example processing, constructions, and attributes may otherwise be as described above in connection with FIGS. 1-4. The contacting of the first material with a non-oxygen-containing gas may form the second material to be conductive, insulative, or semiconductive.

Figure 5:
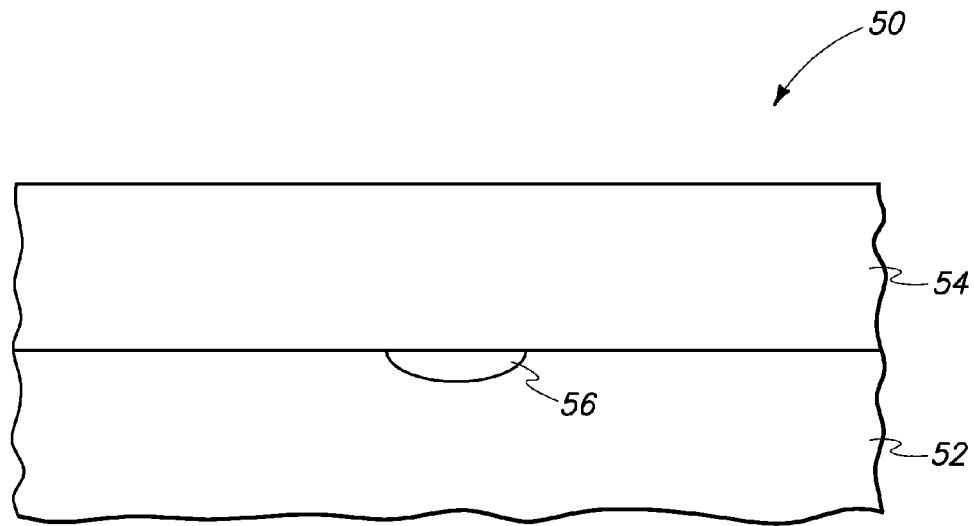
FIGS. 5-8 illustrate cross-sectional views of a portion of a substrate during various stages of fabrication in accordance with an embodiment of the invention.

Another example embodiment is described in connection with a substrate 50 in FIGS. 5-8. Referring to FIG. 5, substrate 50 comprises a silicon-comprising material 52 having a dielectric material 54 formed thereover. By way of example only, an example material 52 is at least one of monocrystalline silicon or polysilicon. An example dielectric material 54 is one or a combination of any of doped or undoped silicon oxides, and/or silicon nitride. An example conductively doped diffusion region 56 has been formed within silicon-comprising material 52.

Figure 6:
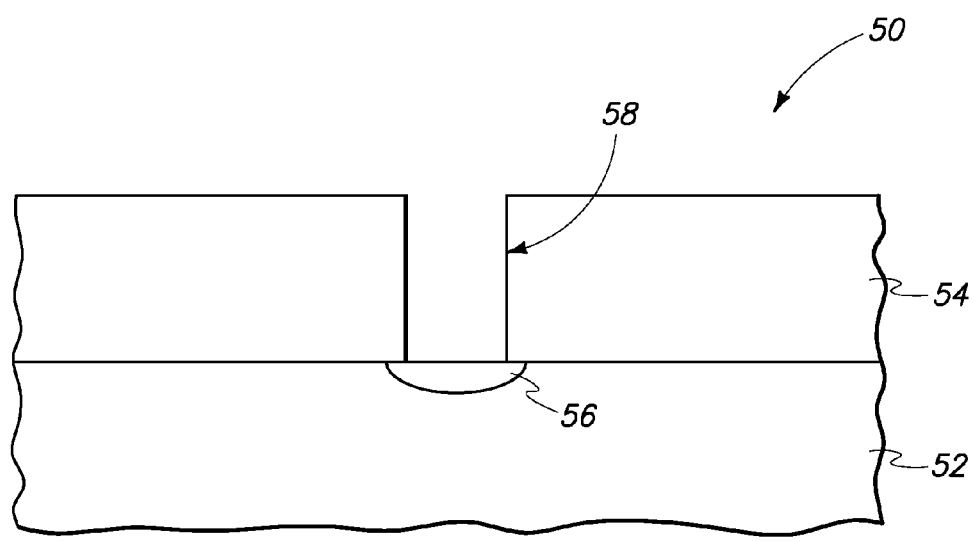

Referring to FIG. 6, the substrate 50 of FIG. 5 has been provided within a dry etch chamber (not shown), and an opening 58 has been etched through dielectric material 54 to expose silicon-comprising material 52. In the depicted example, opening 58 is formed over diffusion region 56.

Figure 7:
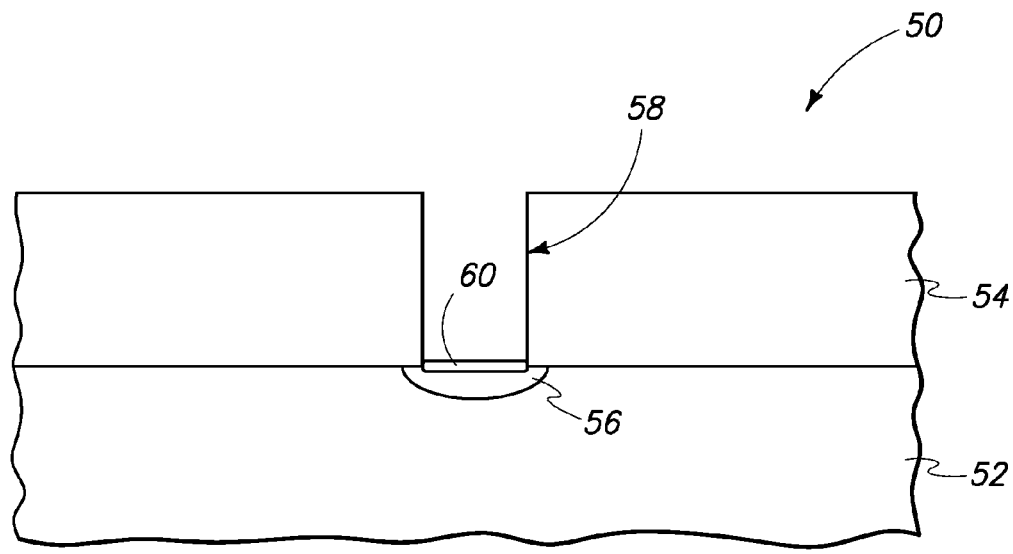

Referring to FIG. 7 and after the etching of FIG. 6, silicon-comprising material 52 has been contacted with a fluorine-containing gas in situ within the dry etch chamber within which the FIG. 6 etching occurred effective to form a fluoro-silicate material 60 which physically contacts onto silicon-comprising material 52 at a base of opening 58. By way of example only, an example fluorine-containing gas is any fluorocarbon and $NH_3$, and an example fluoro-silicate material 60 formed therefrom comprises $(NH_4)_2SiF_6$. In one embodiment, fluoro-silicate material 60 is insulative. In one embodiment, silicon-comprising material 52 may be contacted with metal-containing gas, for example a metal halide or metal organic, in situ within the dry etch chamber within which the FIG. 6 etching occurred effective to form a metal silicide.

Figure 8:
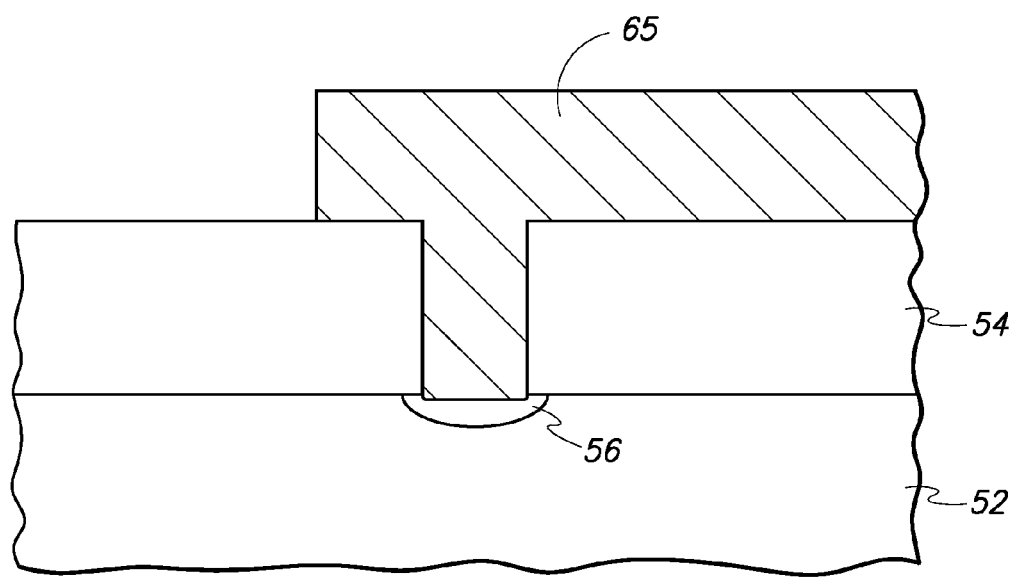

In one embodiment where fluoro-silicate material is formed, such may be removed from the opening and a conductive material is deposited within the opening to physically contact onto the silicon-comprising material, thereby forming a conductive connection to a silicon-comprising material. The removing of the fluoro-silicate material might occur separate from the depositing of the conductive material (before or after), and/or might occur during depositing of the conductive material. Regardless, FIG. 8 depicts a conductive material 65 having been deposited to within opening 58 and which physically contacts silicon-comprising material 52, and in the depicted example conductive diffusion region 56 thereof. Any of the above described processing, attributes, and conductive materials for material 40 might also be used with respect to conductive material 65. FIG. 8 depicts fluoro-silicate material 60 (not shown) of FIG. 7 having been removed from within opening 58. An example technique for removing such material separate from depositing of material 65 includes plasma etching with a combination of Ar and $N_2$ at from about 100° C. to about 400° C. at from about 10 mTorr to about 100 mTorr. Example alternate techniques for removing fluoro-silicate material 60 from within opening 58 during deposition of material 65 include wet etching with an ammonia peroxide mixture, or with deionized water at a temperature of at least 90° C.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of processing a substrate, comprising:
    forming a first material of a substrate;
    forming a second material over the first material;
    etching the second material to expose the first material; and
    after the etching, contacting the first material with a gas to form a third material physically contacting the first material, the third material comprising a metal component of the first material and a component of the gas.

2. The method of claim 1 wherein the metal within the first material is in elemental form.

3. The method of claim 1 wherein the metal within the first material is in metal compound form.

4. The method of claim 1 wherein the contacting forms the third material to be conductive.

5. The method of claim 1 wherein the contacting forms the third material to be insulative.

6. The method of claim 1 wherein the gas comprises an organic compound, and the component of the gas within the third material comprises a carbonyl.

7. The method of claim 1 wherein the gas comprises a halogen, and the component of the gas within the third material comprises the halogen.

8. The method of claim 1 wherein the second material is insulative.

9. The method of claim 8 wherein the etching is of an opening in the insulative material.

10. A method of forming a conductive connection to a substrate, comprising:
    forming a dielectric material over a conductive structure within a substrate;
    etching an opening through the dielectric material to expose the conductive structure;
    after the etching, contacting the conductive structure with a gas to form a conductive first material within the opening, the conductive first material comprising a metal component of the conductive structure and a component of the gas; and
    depositing a conductive second material within the opening in conductive connection with the conductive first material.

11. The method of claim 10 wherein the component of the gas comprises oxygen, and the conductive first material comprises a conductive metal oxide.

12. The method of claim 11 wherein the component of the conductive structure comprises tungsten, and the conductive second material comprises tungsten oxide.

13. The method of claim 10 wherein the conductive structure is a line received within an insulative material.

14. The method of claim 10 wherein the component of the conductive structure within the conductive first material comprises tungsten, and the component of the gas within the conductive first material comprises a halogen.

15. A method of forming a conductive connection to a copper-comprising conductor, comprising:
- forming a dielectric material over a copper-containing conductor on a substrate;
- etching an opening through the dielectric material to expose the copper-containing conductor;
- after the etching, contacting the copper-containing conductor with a metal-containing gas to form a conductive copper-comprising alloy physically contacting the copper-containing conductor at a base of the opening, the conductive copper-comprising alloy comprising copper and a metal from the gas comprising at least one of Al, Mg, Ti, Sn, and In; and
- depositing conductive material within the opening in conductive connection.

16. A method of forming a conductive connection to a silicon-comprising material, comprising:
- forming a dielectric material over a silicon-comprising material of a semiconductor substrate, the silicon-comprising material comprising a material selected from monocrystalline silicon and polysilicon;
- etching an opening through the dielectric material to expose the silicon-comprising material;
- after the etching, contacting the silicon-comprising material with a fluorine-containing gas to form a fluoro-silicate material physically contacting the silicon-comprising material; and
- removing the fluoro-silicate material from the opening and depositing a conductive material within the opening physically contacting onto the silicon-comprising material.

* * * * *